(12) United States Patent
Shin et al.

(10) Patent No.: US 8,803,147 B2
(45) Date of Patent: Aug. 12, 2014

(54) ARRAY SUBSTRATE FOR FRINGE FIELD SWITCHING MODE LIQUID CRYSTAL DISPLAY DEVICE AND METHOD OF MANUFACTURING THE SAME

(75) Inventors: Ki-Taeg Shin, Gyeongsangbuk-do (KR); Sung-Jin Kim, Daegu (KR)

(73) Assignee: LG Display Co., Ltd., Seoul (KR)

( * ) Notice: Subject to any disclaimer, the term of this patent is extended or adjusted under 35 U.S.C. 154(b) by 69 days.

(21) Appl. No.: 13/218,803

(22) Filed: Aug. 26, 2011

(65) Prior Publication Data

US 2012/0086009 A1 Apr. 12, 2012

(30) Foreign Application Priority Data

Oct. 7, 2010 (KR) .................. 10-2010-0097822

(51) Int. Cl.
*H01L 33/08* (2010.01)
*H01L 27/12* (2006.01)

(52) U.S. Cl.
CPC .................. *H01L 27/1214* (2013.01)
USPC ............. 257/59; 438/157; 438/104; 438/158; 438/30; 438/29

(58) Field of Classification Search
USPC ........ 257/59, E33.053, E21.412, 43, E21.411
See application file for complete search history.

(56) References Cited

U.S. PATENT DOCUMENTS

| 2005/0243228 A1* | 11/2005 | Lee et al. ................. 349/42 |
| 2006/0290866 A1* | 12/2006 | Choi et al. ................ 349/141 |
| 2007/0166859 A1* | 7/2007 | Lee et al. ................. 438/30 |
| 2009/0322975 A1* | 12/2009 | Song et al. ................ 349/46 |
| 2010/0141879 A1* | 6/2010 | Lee et al. ................. 349/114 |
| 2010/0182526 A1* | 7/2010 | Lee et al. ................. 349/43 |

FOREIGN PATENT DOCUMENTS

| KR | 10-2006-0079035 A | 7/2006 |
| KR | 10-2008-0012676 A | 2/2008 |
| KR | 10-2010-0098900 A | 9/2010 |

* cited by examiner

*Primary Examiner* — Benjamin Sandvik
*Assistant Examiner* — Rodolfo Fortich
(74) *Attorney, Agent, or Firm* — Morgan, Lewis & Bockius LLP

(57) ABSTRACT

A method of manufacturing an array substrate for an FFS mode LCD device includes forming a gate line and a gate electrode on a substrate, forming a pixel electrode in the pixel region, forming a gate insulating layer on the gate line, the gate electrode and the pixel electrode, forming a data line, a source electrode, a drain electrode, and a semiconductor layer on the gate insulating layer, forming a passivation layer on the data line, the source electrode and the drain electrode, the passivation layer including a drain contact hole and a pixel contact hole, and forming a connection pattern and a common electrode on the passivation layer, wherein the common electrode includes bar-shaped first openings in the pixel region, and the connection pattern contacts the drain electrode and the pixel electrode through the drain contact hole and the pixel contact hole, respectively.

16 Claims, 14 Drawing Sheets

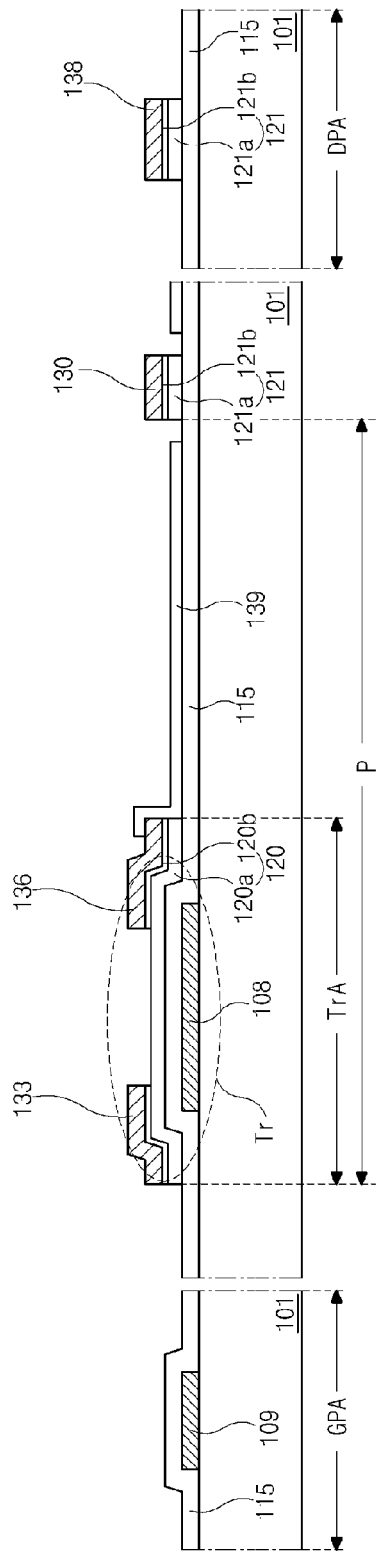
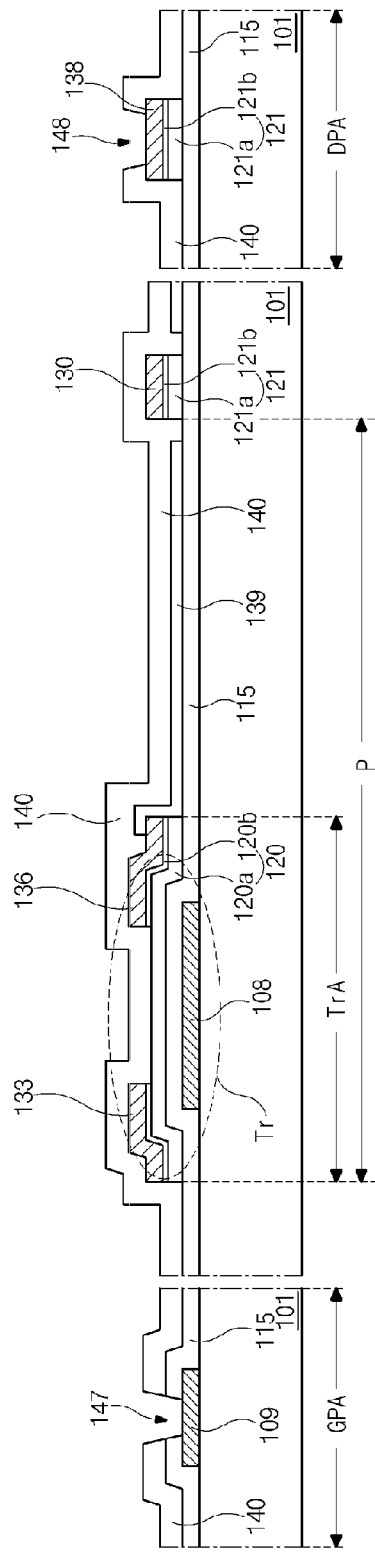
FIG. 5E
FIG. 5F

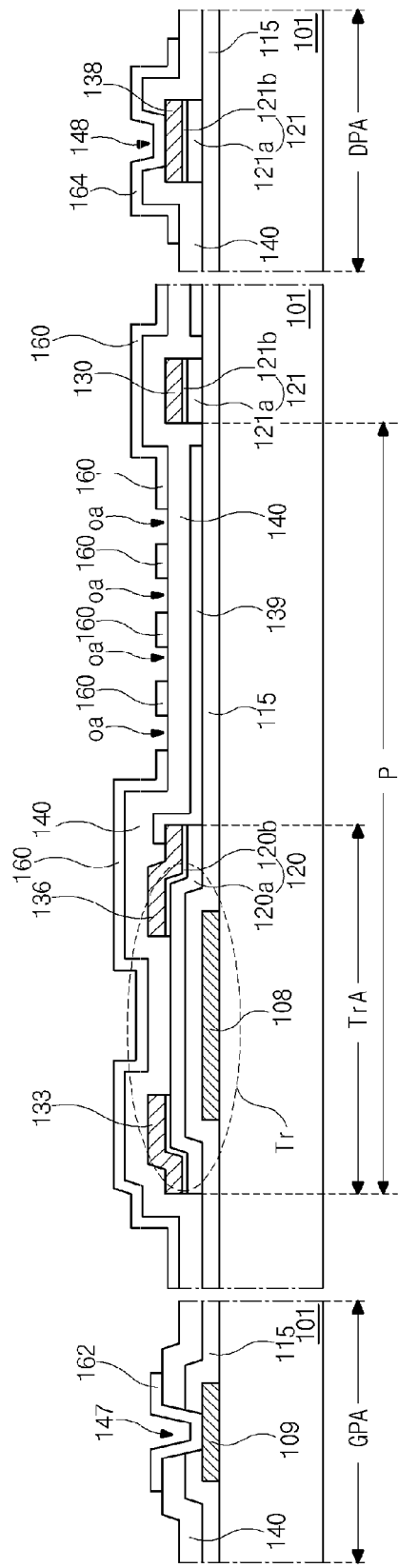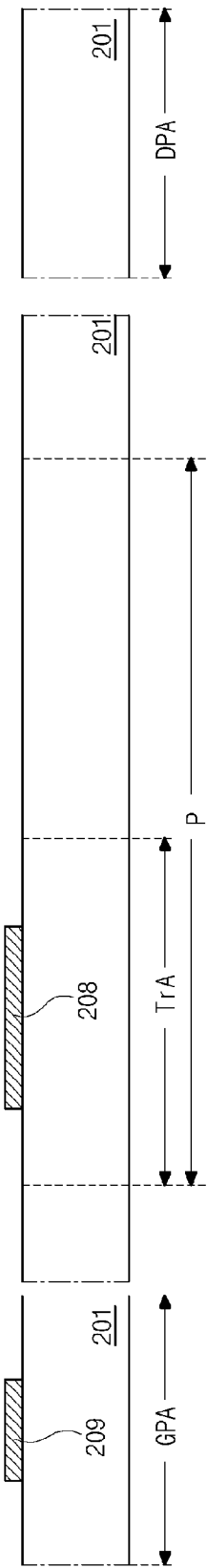
FIG. 5G
FIG. 6A

US 8,803,147 B2

ARRAY SUBSTRATE FOR FRINGE FIELD SWITCHING MODE LIQUID CRYSTAL DISPLAY DEVICE AND METHOD OF MANUFACTURING THE SAME

CROSS REFERENCE TO RELATED APPLICATION

This application claims the benefit of Korean Patent Application No. 10-2010-0097822 filed on Oct. 7, 2010, which is hereby incorporated by reference for all purposes in its entirety.

BACKGROUND OF THE INVENTION

1. Field of the Invention

The invention relates to a liquid crystal display device, and more particularly, to an array substrate for a fringe field switching (FFS) mode liquid crystal display (LCD) device and a method of manufacturing the same.

2. Discussion of the Related Art

Generally, a liquid crystal display (LCD) device uses optical anisotropy and polarization properties of liquid crystal molecules. The liquid crystal molecules have a definite alignment direction as a result of their thin and long shapes. The alignment direction of the liquid crystal molecules can be controlled by applying an electric field across the liquid crystal molecules.

In other words, as the intensity or direction of the electric field is changed, the alignment of the liquid crystal molecules also changes. Since incident light is refracted based on the orientation of the liquid crystal molecules due to the optical anisotropy of the liquid crystal molecules, images can be displayed by controlling the light transmittance of the liquid crystal molecules.

Since the LCD device including thin film transistors as a switching element, referred to as an active matrix LCD (AM-LCD) device, has excellent resolution in displaying moving images, the AM-LCD device has been widely used.

The AM-LCD device includes an array substrate, a color filter substrate and a liquid crystal layer interposed therebetween. The array substrate may include a pixel electrode and a thin film transistor, and the color filter substrate may include a color filter layer and a common electrode. The AM-LCD device is driven by an electric field between the pixel electrode and the common electrode and thus has excellent properties of transmittance and aperture ratio. Since the AM-LCD device uses a vertical electric field that is perpendicular to the substrates, however, the AM-LCD device has poor viewing angles.

An in-plane switching (IPS) mode LCD device having a wide viewing angle property has been suggested and developed to resolve the above-mentioned limitations.

FIG. 1 is a cross-sectional view of a related art IPS mode LCD device. As shown in FIG. 1, the IPS mode LCD device includes an upper substrate 9 and a lower substrate 10 spaced apart from and facing each other. A liquid crystal layer 11 is interposed between the upper and lower substrates 9 and 10. A common electrode 17 and a pixel electrode 30 are formed on the lower substrate 10. The common electrode 17 and the pixel electrode 30 may be disposed on the same level. Liquid crystal (LC) molecules of the liquid crystal layer 11 are driven by a horizontal electric field L, which is induced between the common and pixel electrodes 17 and 30. Although not shown in the figure, a color filter layer is formed on the upper substrate 9. The upper substrate 9 including the color filter layer may be referred to as a color filter layer. The lower substrate 10 including the common electrode 17 and the pixel electrode 30 may be referred to as an array substrate.

FIGS. 2A and 2B are cross-sectional views showing turned on/off conditions, respectively, of a related art IPS mode LCD device. As shown in FIGS. 2A and 2B, when the voltage is applied to the IPS mode LCD device, arrangement of liquid crystal molecules 11a above the common electrode 17 and the pixel electrode 30 is unchanged. However, liquid crystal molecules 11b between the common electrode 17 and the pixel electrode 30 are horizontally arranged due to the horizontal electric field L. Since the liquid crystal molecules 11b are arranged by the horizontal electric field L, the IPS mode LCD device has a wide viewing angle property. For example, the IPS mode LCD device has viewing angles of about 80 degrees to about 85 degrees up and down and right and left without an image inversion or a color inversion.

FIG. 2B shows a condition when the voltage is not applied to the IPS mode LCD device. Because an electric field is not induced between the common and pixel electrodes 17 and 30, the arrangement of liquid crystal molecules 11 of the liquid crystal layer is not changed.

Despite the advantages of the IPS mode LCD device described above, however, this device has disadvantages of low aperture ratio and transmittance. To improve the aperture ratio and transmittance of the IPS mode LCD device, a fringe field switching (FFS) mode LCD device has been suggested.

FIG. 3 is a plan view of a pixel region of an array substrate for a related art FFS mode LCD device.

As shown in FIG. 3, a gate line 43 is formed along a direction, and a data line 51 crosses the gate line 43 to define a pixel region P.

A thin film transistor Tr, as a switching element, is formed at the pixel region P and is connected to the gate line 43 and the data line 51. The thin film transistor Tr includes a gate electrode 45, a gate insulating layer (not shown), a semiconductor layer (not shown), and source and drain electrodes 55 and 58.

A pixel electrode 60 is formed at the pixel region P and is electrically connected to the drain electrode 58 of the thin film transistor Tr through a drain contact hole 59. The pixel electrode 60 has a plate shape.

A common electrode 75 is formed substantially all over a display area including a plurality of pixel regions P and includes openings oa corresponding to each pixel region P. The openings oa has a bar shape and are spaced apart from each other. Here, even though the common electrode 75 is formed substantially all over the display area, for the convenience of explanation, the common electrode 75 is indicated by a dashed line corresponding to the pixel region P.

In the array substrate of the related art FFS mode LCD device having the above-mentioned structure, a voltage is applied to the pixel electrode 60 having a plate shape and the common electrode 75 having the bar-shaped openings oa in the pixel region, and a fringe field is induced therebetween.

The array substrate for the related art FFS mode LCD device has been commonly manufactured through 6 mask processes as shown below.

FIGS. 4A to 4F are cross-sectional views of an array substrate for a related art FFS mode LCD device during the steps of fabrication according to the related art.

In FIG. 4A, a metal material layer (not shown) is formed on a substrate 40 and is patterned through a mask process, which includes applying photoresist, exposing the photoresist to light, developing the light-exposed photoresist, etching the metal material layer, and stripping the photoresist, to thereby form a gate electrode 43 on a switching area TrA, a gate line (not shown), and a gate pad electrode 44 on a gate pad area GPA. The gate line extends along a direction, and the gate electrode 43 and the gate pad electrode 44 are connected to the gate line. FIG. 4A also shows a data pad area DPA of the LCD device.

In FIG. 4B, a gate insulating layer 46 is formed on the gate line and the gate electrode 43, and subsequently an intrinsic amorphous silicon layer (not shown) and an impurity-doped amorphous silicon layer (not shown) are formed on the gate insulating layer 46. The intrinsic amorphous silicon layer and the impurity-doped amorphous silicon layer are patterned through a mask process to thereby form an active layer 49a and an impurity-doped amorphous silicon pattern 48 on the gate insulating layer 46 corresponding to the gate electrode 43.

Next, in FIG. 4C, a transparent conductive material is deposited on a substantially entire surface of the substrate 40 including the active layer 49a and the impurity-doped amorphous silicon pattern 48 and is patterned through a mask process to thereby form a pixel electrode 50 in the pixel region P.

In FIG. 4D, a metal layer (not shown) is formed on the pixel electrode 50 and the impurity-doped amorphous silicon pattern 48 of FIG. 4C and is patterned to thereby form a data line 52, a data pad electrode 53, and source and drain electrodes 54 and 56. The data line 52 crosses the gate line (not shown). The data pad electrode 53 is connected to the data line 52. The source and drain electrodes 54 and 56 are spaced apart from each other over the impurity-doped amorphous silicon pattern 48 of FIG. 4C. The source electrode 54 is connected to the data line 52. One end of the drain electrode 56 is extended onto the pixel electrode 50 and contacts the pixel electrode 50.

Then, the impurity-doped amorphous silicon pattern 48 of FIG. 4C exposed between the source and drain electrode 54 and 56 is removed to thereby form ohmic contact layers 49b, which are spaced apart from each other under the source and drain electrodes 54 and 56, respectively. Here, the active layer 49a and the ohmic contact layers 49b constitute a semiconductor layer 49. The gate electrode 43, the gate insulating layer 46, the semiconductor layer 49, and the source and drain electrodes 54 and 56 form a thin film transistor Tr.

In FIG. 4E, a passivation layer 60 is formed on the data line 52 and the source and drain electrodes 54 and 56 and is patterned to thereby form gate and data pad contact holes 62 and 64 exposing the gate and data pad electrodes 44 and 53, respectively.

Next, in FIG. 4F, a transparent conductive material layer (not shown) is formed on the passivation layer 60 including the gate and data pad contact holes 62 and 64 by depositing a transparent conductive material and is patterned through a mask process to thereby form a common electrode 65. The common electrode 65 includes bar-shaped openings oa corresponding to the pixel electrode 50 in the pixel region P. Accordingly, the array substrate for the FFS mode LCD device according to the related art is completed.

As shown above, the array substrate according to the related art is manufactured through 6 mask processes, and each mask process includes steps of applying photoresist, exposing the photoresist to light through a photo-mask, developing the light-exposed photoresist, etching a material layer, and stripping the photoresist. As the number of mask processes increases, the manufacturing time is lengthened, the productivity per unit time is lowered, and the manufacturing costs are raised. Therefore, an improved array substrate requiring fewer mask processes is desired.

Moreover, recently, as the display device has a large size, the signal lines become longer, and there is a problem of signal delays due to the resistance of the signal lines. Thus, an improved array substrate with less resistance of the signal lines is also desired.

SUMMARY OF THE INVENTION

Accordingly, the present invention is directed to an array substrate for a fringe field switching mode liquid crystal display device and a method of manufacturing the same that substantially obviate one or more of the problems due to limitations and disadvantages of the related art.

One object of the present invention relates to an array substrate for a fringe field switching mode liquid crystal display device and a method of manufacturing the same that has the large size without signal delays, reduces the number of mask processes, decrease the manufacturing costs and time, and improve the productivity.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

In one aspect, to achieve these and other advantages and in accordance with the purpose of some embodiments of the invention, as embodied and broadly described, a method of manufacturing an array substrate for an FFS mode LCD device may include forming a gate line and a gate electrode on a substrate; forming a pixel electrode in the pixel region; forming a gate insulating layer on the gate line, the gate electrode and the pixel electrode; forming a data line, a source electrode, a drain electrode, and a semiconductor layer on the gate insulating layer, the data line crossing the gate line to define the pixel region, the semiconductor layer disposed over the gate electrode, the source electrode and the drain electrode spaced apart from each other over the semiconductor layer, the drain electrode overlapping the pixel electrode; forming a passivation layer on the data line, the source electrode and the drain electrode, the passivation layer including a drain contact hole and a pixel contact hole; and forming a connection pattern and a common electrode on the passivation layer, wherein the common electrode includes bar-shaped first openings in the pixel region, and the connection pattern contacts the drain electrode and the pixel electrode through the drain contact hole and the pixel contact hole, respectively.

In another aspect, an array substrate for a fringe field switching mode liquid crystal display device according to the present invention may include a gate line and a gate electrode on a substrate including a pixel region defined thereon, a pixel electrode in the pixel region on the substrate, a gate insulating layer on the gate line, the gate electrode and the pixel electrode, a data line on the gate insulating layer and crossing the gate line to define the pixel region, a semiconductor layer, a source electrode and a drain electrode on the gate insulating layer corresponding to the gate electrode, a passivation layer on the data line, the source electrode and the drain electrode, wherein the passivation layer has a drain contact hole and a pixel contact hole exposing the drain electrode and the pixel electrode, respectively, a connection pattern on the passivation layer and contacting the drain electrode and the pixel electrode through the drain contact hole and the pixel contact hole, and a common electrode on the passivation layer and including bar-shaped first openings corresponding to the pixel electrode.

It is to be understood that both the foregoing general description and the following detailed description are only exemplary and are intended to provide further explanation of the invention as claimed.

BRIEF DESCRIPTION OF THE DRAWINGS

The accompanying drawings are included to provide a further understanding of the invention and are incorporated in and constitute a part of this specification. The drawings illustrate embodiments of the invention and together with the description serve to explain the principles of the invention. In the drawings:

FIGS. 5A to 5G are cross-sectional views of an array substrate for a fringe field switching (FFS) mode liquid crystal display (LCD) device during the steps of its fabrication according to one exemplary embodiment of the invention; and FIGS. 6A to 6F are cross-sectional views of an array substrate for a FFS mode LCD device during the steps of its fabrication according to another exemplary embodiment of the invention.

DETAILED DESCRIPTION OF EXEMPLARY EMBODIMENTS

Reference will now be made in detail to exemplary embodiments of the invention, which are illustrated in the accompanying drawings. Wherever possible, the same reference numbers will be used throughout the drawings to refer to the same or like parts. It will be paid attention that detailed description of known arts will be omitted if it is determined that the arts can mislead the present invention.

FIGS. 5A to 5G are cross-sectional views of an exemplary array substrate for a fringe field switching (FFS) mode liquid crystal display (LCD) device during the steps of its fabrication according to one exemplary embodiment of the invention. FIGS. 5A to 5G show one pixel region P, a gate pad area GPA, and a data pad area DPA. For the convenience of explanation, a switching area TrA where a thin film transistor is formed is defined in the pixel region.

Figure 1:
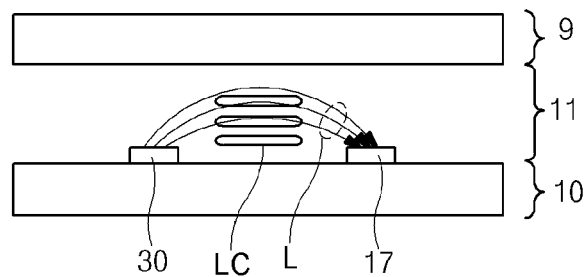
FIG. 1 is a cross-sectional view of a related art IPS mode LCD device.
Figure 2A:
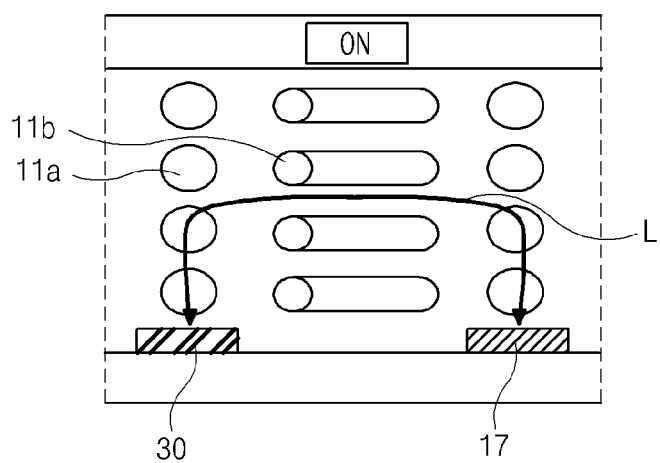
FIGS. 2A and 2B are cross-sectional views showing turned on/off conditions, respectively, of a related art IPS mode LCD device.
Figure 2B:
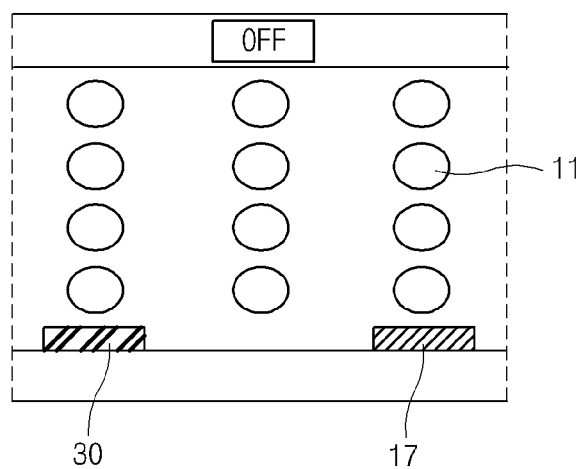
Figure 3:
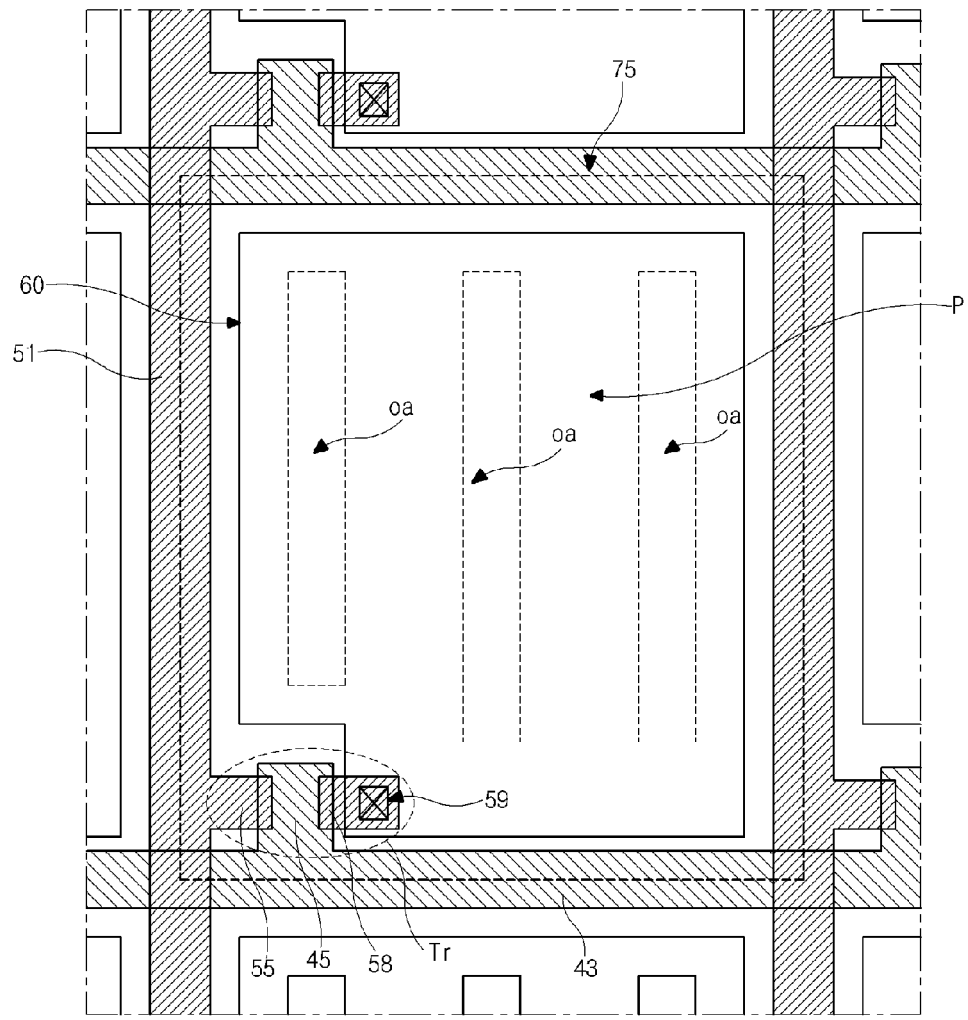
FIG. 3 is a plan view of a pixel region of an array substrate for a related art FFS mode LCD device.
Figure 4A:
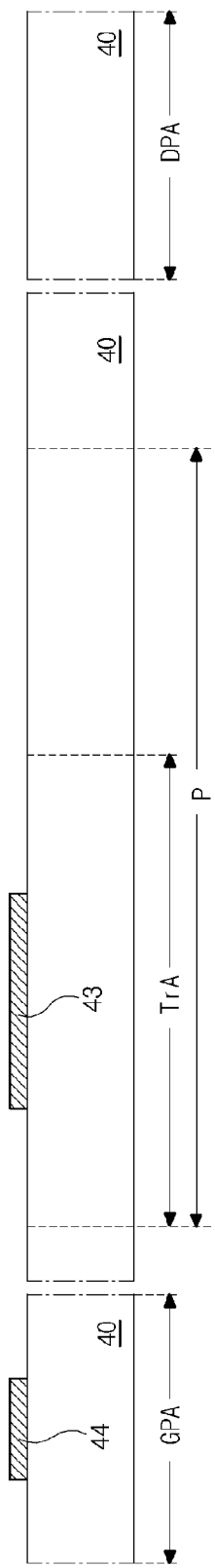
FIGS. 4A to 4F are cross-sectional views of an array substrate for a related art FFS mode LCD device during the steps of its fabrication according to the related art.
Figure 4B:
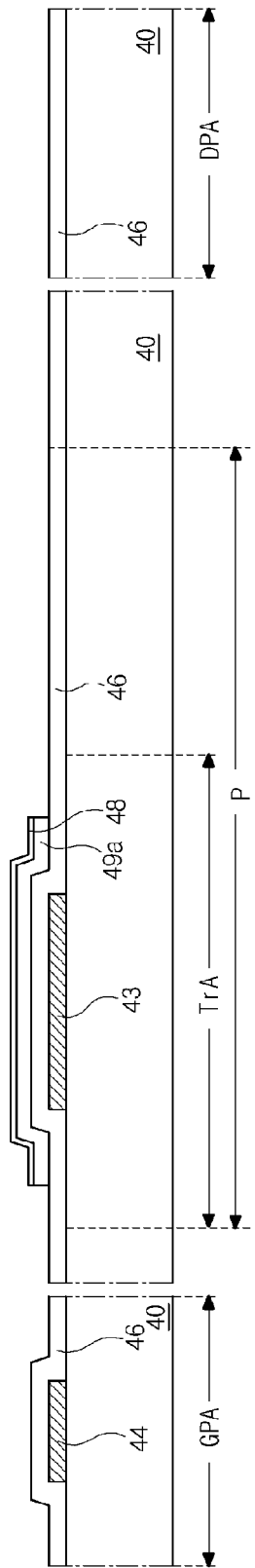
Figure 4C:
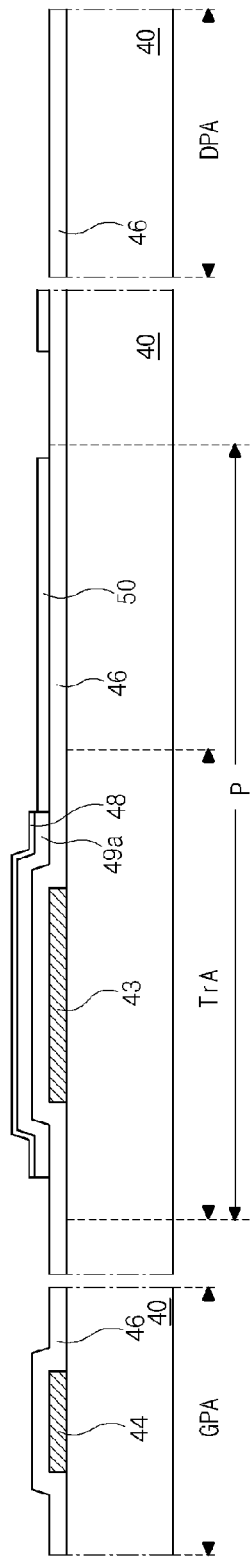
Figure 4D:
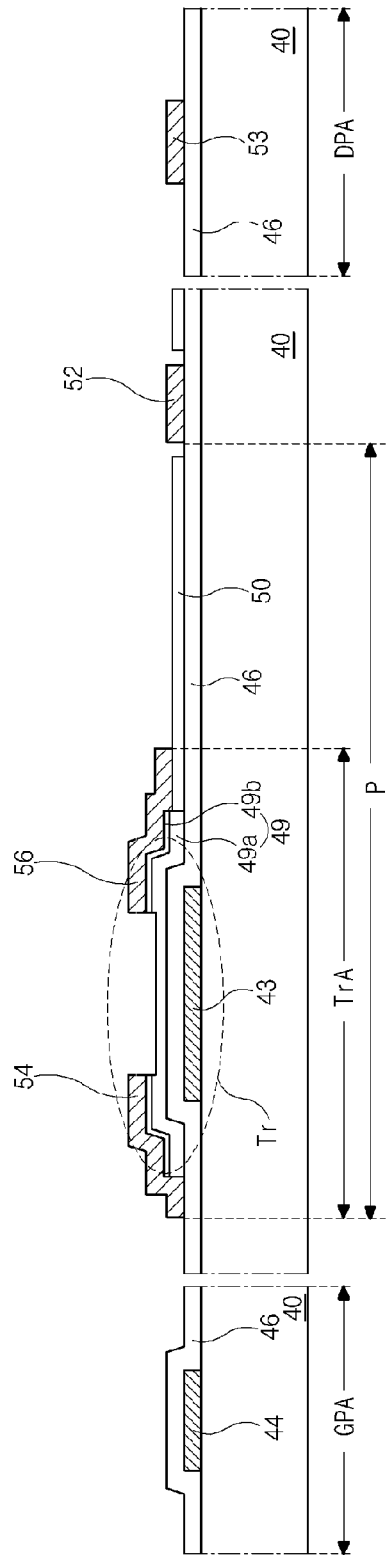
Figure 4E:
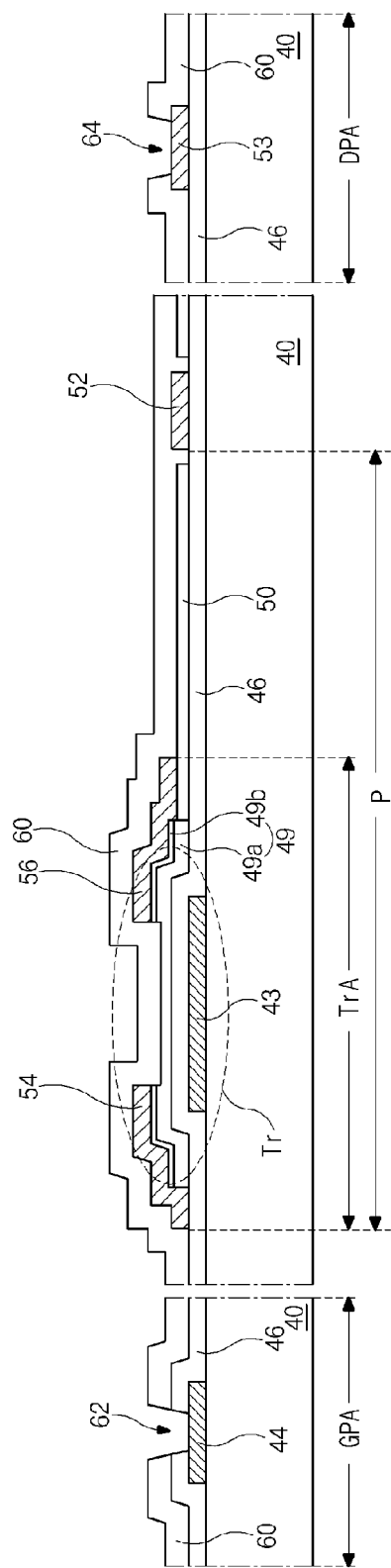
Figure 4F:
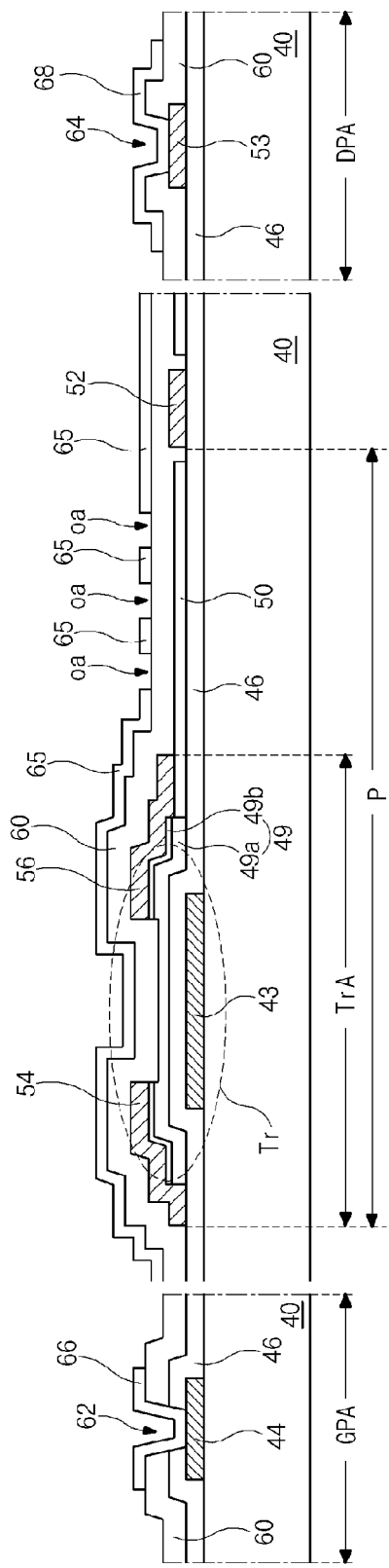
Figure 5A:
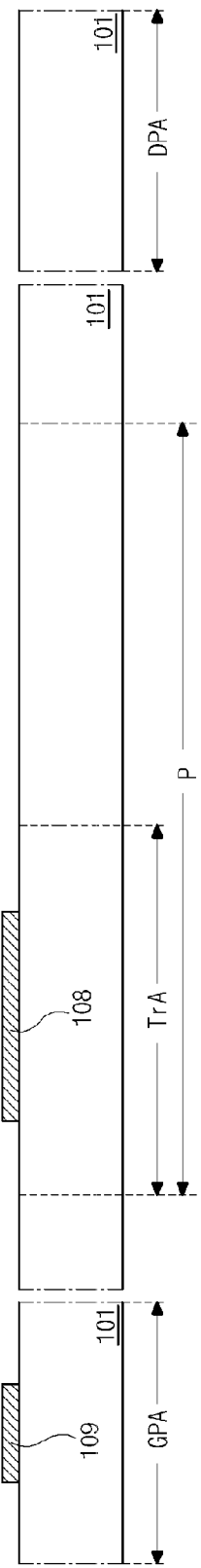

According to the exemplary embodiment shown in FIG. 5A, a first metal layer (not shown) is formed on a substantially entire surface of a transparent insulating substrate 101 by depositing one or more metals or metal alloys including, but not limited to, aluminum (Al), aluminum alloy, such as aluminum neodymium (AlNd), copper (Cu), copper alloy, molybdenum (Mo), molybdenum alloy, such as molybdenum titanium (MoTi), chromium (Cr), and a mixture thereof. The first metal layer may have a single-layered structure or a multi-layered structure.

In some embodiments, the first metal layer is patterned through a mask process, including, but not limited to, applying photoresist, exposing the photoresist to light through a photo-mask, developing the light-exposed photoresist, etching the first metal layer, and stripping the photoresist, to thereby form a gate line (not shown), a gate electrode 108, and a gate pad electrode 109. The gate line extends along a first direction. The gate electrode 108 is disposed in the switching area TrA and is connected to the gate line. The gate pad electrode 109 is disposed in the gate pad area GPA and is connected to the gate line.

Figure 5B:
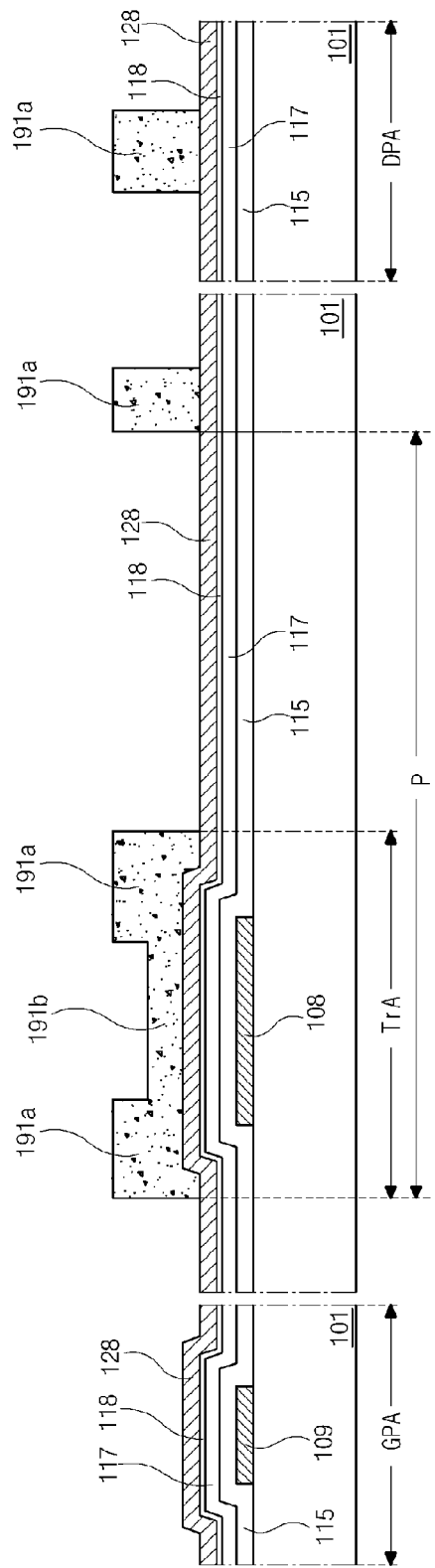

Next, in FIG. 5B, a gate insulating layer 115 is formed on a substantially entire surface of the substrate 101 including the gate line, the gate electrode 108 and the gate pad electrode 109 by depositing an inorganic insulating material including, for example, silicon oxide ($SiO_2$) or silicon nitride (SiNx).

Subsequently, as shown in FIG. 5B, an intrinsic amorphous silicon layer 117 and an impurity-doped amorphous silicon layer 118 are formed on the gate insulating layer 115. A second metal layer 128 can be formed on the impurity-doped amorphous silicon layer 118 by depositing one or more metals or metal alloys including, but not limited to, aluminum (Al), aluminum alloy, such as aluminum neodymium (AlNd), copper (Cu), copper alloy, molybdenum (Mo), molybdenum alloy, such as molybdenum titanium (MoTi), chromium (Cr), and a mixture thereof. The second metal layer 128 may have a single-layered structure or a multi-layered structure.

Then, a photoresist layer (not shown) can be formed on the second metal layer 128. In some embodiments, the photoresist layer is exposed to light through a mask including a halftone layer or slits and is developed to thereby form a first photoresist pattern 191a and a second photoresist pattern 191b. As shown in FIG. 5B, the first photoresist pattern 191a has a first thickness, and the second photoresist pattern 191b has a second thickness thinner than the first thickness. Here, the first photoresist pattern 191a corresponds to areas where source and drain electrodes, a data line and a data pad electrode will be formed later, and the second photoresist pattern 191b corresponds to an area between the source and drain electrodes.

Figure 5C:
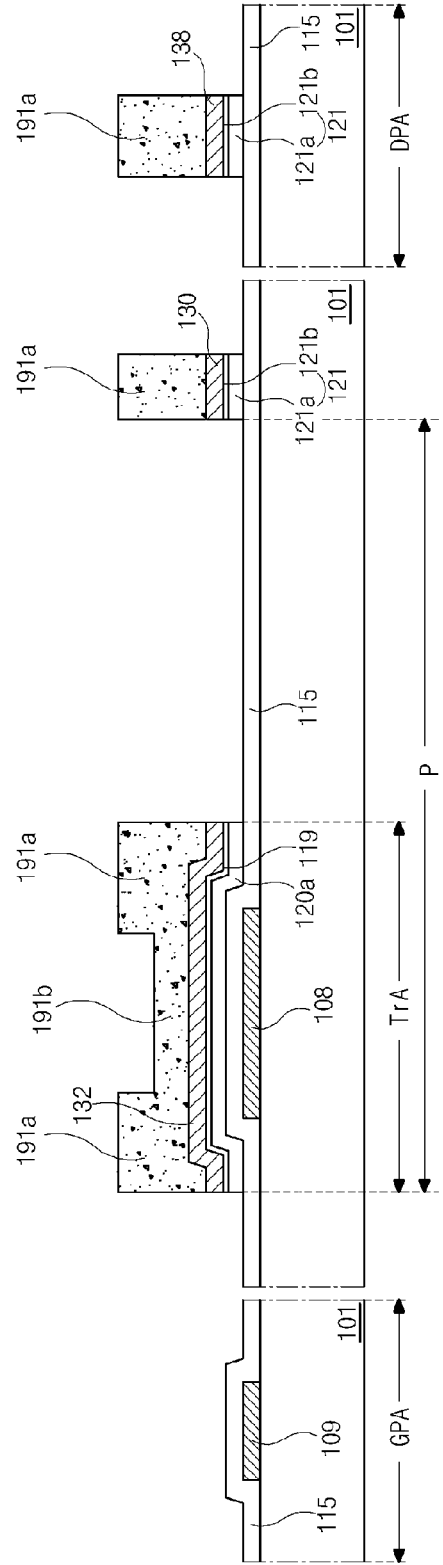

Next, in FIG. 5C, the second metal layer 128 of FIG. 5B, the impurity-doped amorphous silicon layer 118 of FIG. 5B, and the intrinsic amorphous silicon layer 117 of FIG. 5B are etched and removed using the first and second photoresist patterns 191a and 191b as an etching mask to thereby form a data line 130, a data pad electrode 138, a source drain pattern 132, an impurity-doped amorphous silicon pattern 119, and an active layer 120a. The data line 130 extends along a second direction and crosses the gate line (not shown) to define the pixel region P. The source and drain pattern 132 is disposed in the switching area TrA and is connected to the data line 130. The active layer 120a of intrinsic amorphous silicon and the impurity-doped amorphous silicon pattern 119 are sequentially formed under the source drain pattern 132. The data pad electrode 138 is disposed in the data pad area DPA and is connected to the data line 130. Here, a dummy pattern 121 including first and second patterns 121a and 121b of the intrinsic amorphous silicon and the impurity-doped amorphous silicon is formed under the data line 130 and the data pad electrode 138 on the gate insulating layer 115 due to the manufacturing process.

Figure 5D:
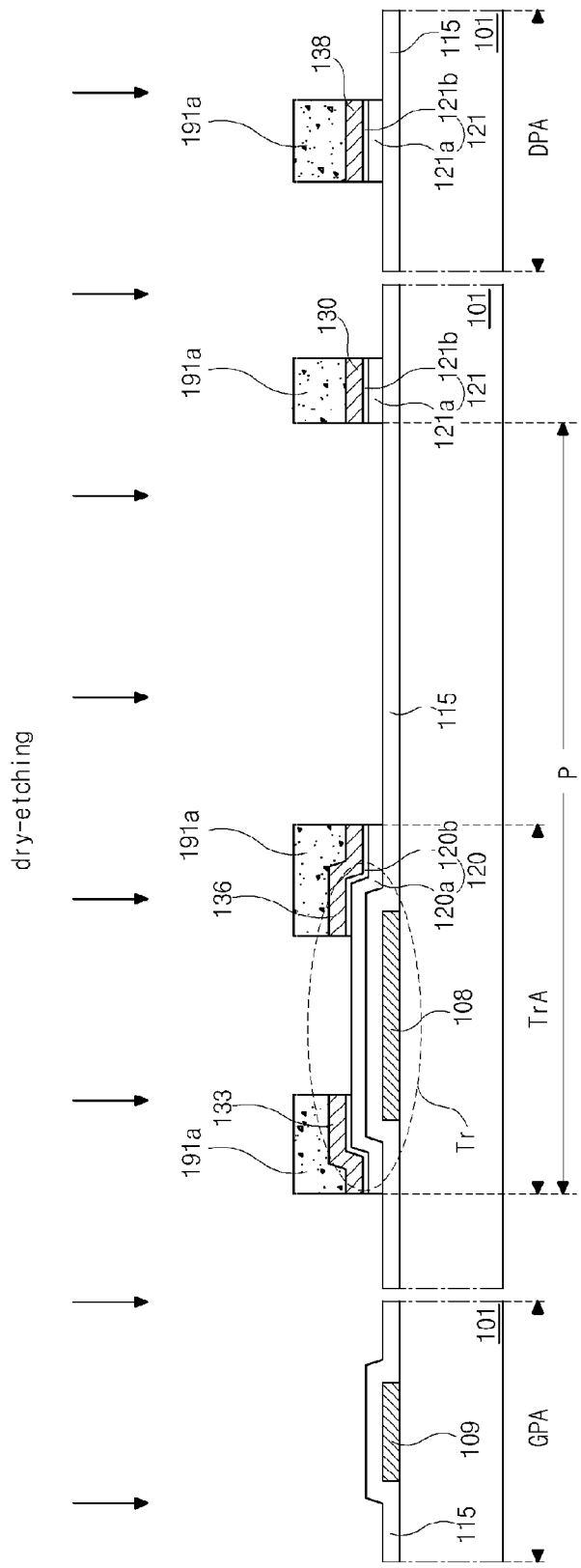

In FIG. 5D, an ashing process is performed to thereby remove the second photoresist pattern 191b of FIG. 5C having the second thickness and expose a central portion of the source drain pattern 132 of FIG. 5C. The first photoresist pattern 191a may also be partially removed by the ashing process, and the first thickness of the first photoresist pattern 191a may be reduced. The exposed central portion of the source drain pattern 132 of FIG. 5C is removed to thereby form source and rain electrodes 133 and 136.

Next, the impurity-doped amorphous silicon pattern 119 of FIG. 5C exposed between the source and drain electrodes 133 and 136 can be dry-etched and removed to thereby form ohmic contact layers 120b and expose the active layer 120a. The ohmic contact layers 120b under the source and drain electrodes 133 and 136 are spaced apart from each other. The active layer 120a and the ohmic contact layers 120b constitute a semiconductor layer 120.

In the switching area TrA, the gate electrode 108, the gate insulating layer 115, the semiconductor layer 120, and the source and drain electrodes 133 and 136 form a thin film transistor Tr, a switching element.

In FIG. 5E, a stripping process is performed, and the first photoresist pattern 191a of FIG. 5D on the source and drain electrodes 133 and 136, the data line 130 and the data pad electrode 138 is removed to thereby expose the data line 130, the data pad electrode 138 and the source and drain electrodes 133 and 136.

Then, a transparent conductive material including, for example, indium tin oxide (ITO) or indium zinc oxide (IZO) can be deposited on a substantially entire surface of the substrate 101 including the source and drain electrodes 133 and 136, the data line 130 and the data pad electrode 138 thereon, thereby forming a first transparent conductive material layer (not shown). The first transparent conductive material layer is patterned through a mask process to thereby form a pixel electrode 139 in the pixel region P. The pixel electrode 139 has a plate shape and overlaps the drain electrode 136.

In FIG. 5F, a passivation layer 140 is formed on a substantially entire surface of the substrate 101 including the thin film transistor Tr, the data line 130 and the data pad electrode 138 by depositing an inorganic insulating material including, for example, silicon oxide ($SiO_2$) or silicon nitride (SiNx) or applying an organic insulating material including, for example, benzocyclobutene (BCB) or photo acryl.

Next, the passivation layer 140 and the gate insulating layer 115 are patterned through a mask process to thereby form a gate pad contact hole 147 in the gate pad area GPA and a data pad contact hole 148 in the data pad area DPA. The gate pad contact hole 147 exposes the gate pad electrode 109, and the data pad contact hole 148 exposes the data pad electrode 138.

In FIG. 5G, a second transparent conductive material layer (not shown) is formed on the passivation layer 140 having the gate and data pad contact holes 147 and 148. The second transparent conductive material layer may be formed by depositing indium tin oxide (ITO) or indium zinc oxide (IZO) on a substantially entire surface of the substrate 101.

Then, the second transparent conductive material layer is patterned through a mask process to thereby form a common electrode 160. The common electrode 160 overlaps the pixel electrode 139 and has bar-shaped openings oa corresponding to the pixel electrode 139 in the pixel region P.

At the same time, an auxiliary gate pad electrode 162 and an auxiliary data pad electrode 164 are formed in the gate pad area GPA and the data pad area DPA, respectively. The auxiliary gate pad electrode 162 contacts the gate pad electrode 109 through the gate pad contact hole 147, and the auxiliary data pad electrode 164 contacts the data pad electrode 138 through the data pad contact hole 148.

Accordingly, the array substrate for the FFS mode LCD device according to the first exemplary embodiment of the present invention is completed.

In the method of manufacturing the array substrate for the FFS mode LCD device according to the above embodiment of the present invention, the gate and data lines may be formed of copper having relatively low resistivity to prevent the signal delays due to the large size. The copper lines, however, may cause decreasing the adhesion and damaging the surface, and thus there may be a contact problems. Specifically, when the gate and data lines are formed of copper or copper alloy and specially are exposed to etchant for the transparent conductive material, the etchant permeates the interface between the pixel electrode and the drain electrode and weakens the adhesion between the pixel electrode and the drain electrode. Therefore, the contact resistance is increased, and the contact problem is caused. Further, the property of the thin film transistor is lowered, and there are problems in driving the device.

In another embodiment of the present invention described below, the array substrate is manufactured through a fewer number of mask processes than the related art and eliminates the problems that are caused by copper and copper alloy used for signal lines, such as gate lines or data lines.

FIGS. 6A to 6F are cross-sectional views of an exemplary array substrate for a FFS mode LCD device during the steps of its fabrication according to some embodiments of the invention. FIGS. 6A to 6F show one pixel region, a gate pad area, and a data pad area. For the convenience of explanation, in this embodiment, a switching area where a thin film transistor is formed is defined in the pixel region.

In FIG. 6A, a first metal layer (not shown) is formed on a substantially entire surface of a transparent insulating substrate 201 by depositing copper (Cu) or copper alloy having relatively low resistivity.

Then, the first metal layer is patterned through a mask process, which includes, but is not limited to, applying photoresist, exposing the photoresist to light through a photomask, developing the light-exposed photoresist, etching the first metal layer, and stripping the photoresist, to thereby form a gate line (not shown), a gate electrode 208, and a gate pad electrode 209. The gate line extends along a first direction. The gate electrode 208 is disposed in the switching area TrA and is connected to the gate line. The gate pad electrode 209 is disposed in the gate pad area GPA and is connected to the gate line.

Specifically, to increase the adhesion, molybdenum (Mo) or molybdenum alloy, such as molybdenum titanium (MoTi), may be first deposited on the insulating substrate 201, and copper or copper alloy may be deposited. These metal materials may be patterned to thereby form the gate line, the gate electrode 208 and the gate pad electrode 209 having a double-layered structure.

Furthermore, in this embodiment, even though the copper or copper alloy is mentioned for forming the gate line, other metal materials, such as aluminum (Al), aluminum alloy, such as aluminum neodymium (AlNd), molybdenum (Mo), molybdenum alloy, such as molybdenum titanium (MoTi), and chromium (Cr), can be used.

Figure 6B:
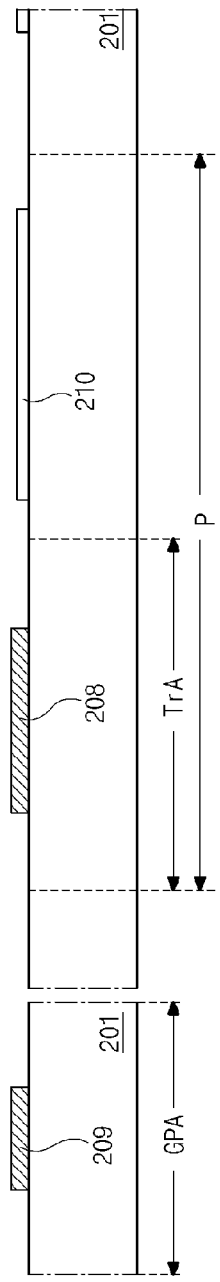

Next, in FIG. 6B, a transparent conductive material, such as indium tin oxide (ITO) or indium zinc oxide (IZO), is deposited on a substantially entire surface of the substrate 201 including the gate line, the gate electrode 208 and the gate pad electrode 209 to thereby form a first transparent conductive material layer (not shown). The first transparent conductive material layer is patterned through a mask process, and a pixel electrode 210 having a plate shape is formed in the pixel region P.

Here, even though the gate line, the gate electrode 208 and the gate pad electrode 209 of copper or copper alloy are exposed to etchant for patterning the transparent conductive material layer, no transparent conductive pattern is formed on the gate line, the gate electrode 208 and the gate pad electrode 209. Therefore, there is no problem of the etchant permeating the interface between the copper or copper alloy and the transparent conductive material, decreasing the adhesion.

In other embodiments, the steps shown in FIGS. 6A and 6B can be combined by utilizing multiple layers including a metal layer and a transparent conductive layer. Specifically, the transparent conductive layer and the metal layer can be deposited on a substrate in order. Then, a transparent conductive material layer and a metal layer are patterned through a single mask process to form a pixel electrode and a gate electrode where the gate electrode includes the multiple layers.

Figure 6C:
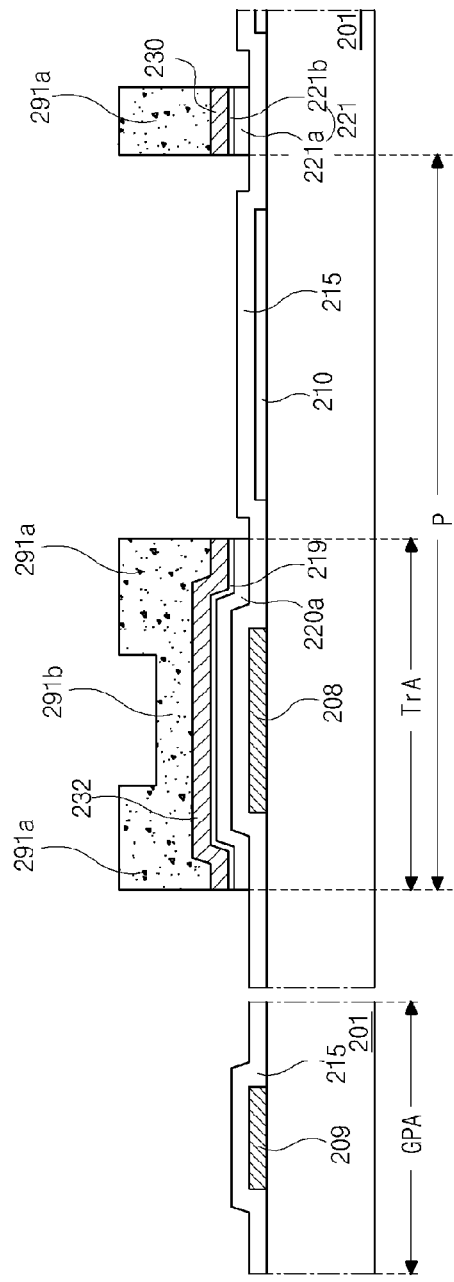

Next, in FIG. 6C, a gate insulating layer 215 is formed on a substantially entire surface of the substrate 201 including the pixel electrode 210, the gate line, the gate electrode 208 and the gate pad electrode 209 by depositing an inorganic insulating material including, for example, silicon oxide (SiO$_2$) or silicon nitride (SiNx).

Subsequently, according to some embodiments, an intrinsic amorphous silicon layer (not shown) and an impurity-doped amorphous silicon layer (not shown) are formed on the gate insulating layer 215, and a second metal layer (not shown) is formed on the impurity-doped amorphous silicon layer by depositing copper (Cu) or copper alloy.

At this time, similarly to the gate line, the second metal layer may have a double-layered structure by depositing molybdenum (Mo) or molybdenum alloy, such as molybdenum titanium (MoTi), on the impurity-doped amorphous silicon layer before depositing copper or copper alloy in order to improve the adhesion. Further, other metal materials described herein may be used for the second metal layer.

Then, a photoresist layer (not shown) can be formed on the second metal layer. In some embodiments, the photoresist layer is exposed to light through a mask including a halftone layer or slits and is developed to thereby form a first photoresist pattern 291a and a second photoresist pattern 291b. As shown in FIG. 6C, the first photoresist pattern 291a has a first thickness, and the second photoresist pattern 29 1b ha a second thickness thinner than the first thickness. Here, the first photoresist pattern 291a corresponds to areas where source and drain electrodes, a data line and a data pad electrode will be formed later, and the second photoresist pattern 29 1b corresponds to an area between the source and drain electrodes.

Next, the second metal layer, the impurity-doped amorphous silicon layer, and the intrinsic amorphous silicon layer are etched and removed using the first and second photoresist patterns 291a and 291b as an etching mask to thereby form a data line 230, a data pad electrode 238, a source drain pattern 232, an impurity-doped amorphous silicon pattern 219, and an active layer 220a. The data line 230 extends along a second direction and crosses the gate line (not shown) to define the pixel region P. The source and drain pattern 232 is disposed in the switching area TrA and is connected to the data line 230. The active layer 220a of intrinsic amorphous silicon and the impurity-doped amorphous silicon pattern 219 are sequentially formed under the source drain pattern 232. The data pad electrode 238 is disposed in the data pad area DPA and is connected to the data line 230. Here, a dummy pattern 221 including first and second patterns 221a and 221b of the intrinsic amorphous silicon and the impurity-doped amorphous silicon is formed under the data line 230 and the data pad electrode 238 on the gate insulating layer 215 due to the manufacturing process.

Figure 6D:
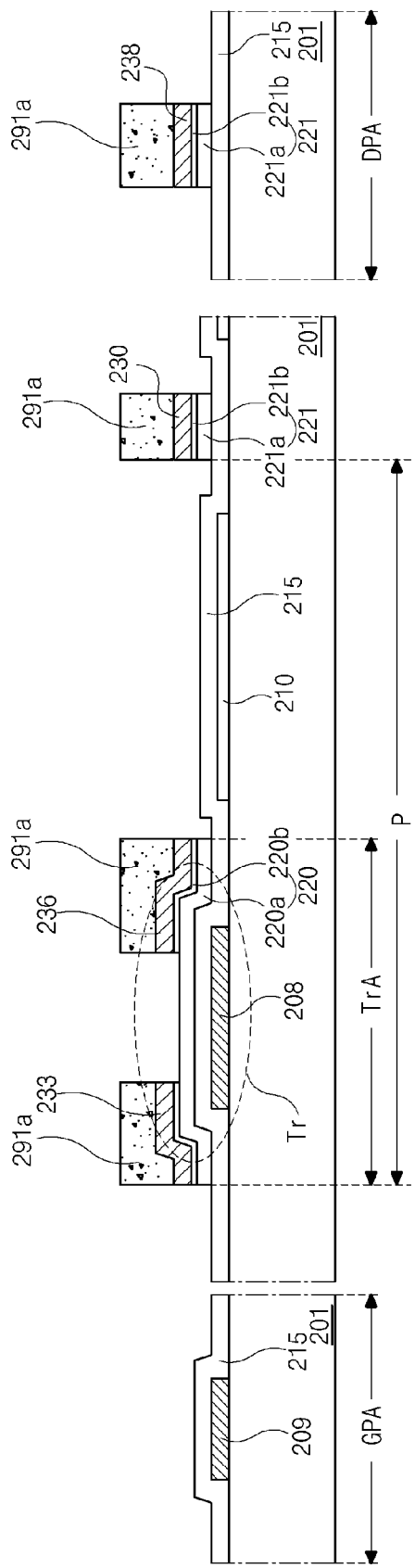

In FIG. 6D, an ashing process is performed to thereby remove the second photoresist pattern 291b of FIG. 6C having the second thickness and expose a central portion of the source drain pattern 232 of FIG. 6C. The first photoresist pattern 291a may also be partially removed by the ashing process, and the first thickness of the first photoresist pattern 291a may be reduced. The exposed central portion of the source drain pattern 232 of FIG. 6C is removed to thereby form source and rain electrodes 233 and 236.

Next, the impurity-doped amorphous silicon pattern 219 of FIG. 6C exposed between the source and drain electrodes 233 and 236 is dry-etched and removed to thereby form ohmic contact layers 220b and expose the active layer 220a. The ohmic contact layers 220b under the source and drain electrodes 233 and 236 are spaced apart from each other. The active layer 220a and the ohmic contact layers 220b constitute a semiconductor layer 220.

In the switching area TrA, the gate electrode 208, the gate insulating layer 215, the semiconductor layer 220, and the source and drain electrodes 233 and 236 form a thin film transistor Tr, a switching element.

Figure 6E:
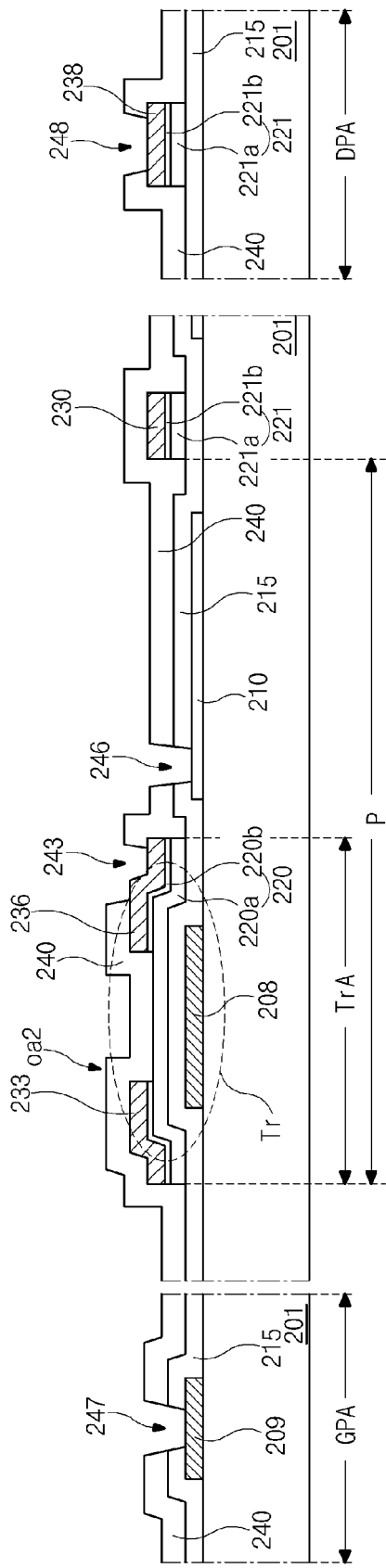

In FIG. 6E, a stripping process is performed, and the first photoresist pattern 291a of FIG. 6D on the source and drain electrodes 233 and 236, the data line 230 and the data pad electrode 238 is removed to thereby expose the data line 230, the data pad electrode 238 and the source and drain electrodes 233 and 236.

Then, a passivation layer 240 is formed on a substantially entire surface of the substrate 201 including the thin film transistor Tr, the data line 230 and the data pad electrode 238 by depositing an inorganic insulating material including, for example, silicon oxide (SiO$_2$) or silicon nitride (SiNx) or applying an organic insulating material including, for example, benzocyclobutene (BCB) or photo acryl.

Next, the passivation layer 240 and the gate insulating layer 215 are patterned through a mask process to thereby form a drain contact hole 243 and a pixel contact hole 246. The drain contact hole 243 exposes the drain electrode 236, and the pixel contact hole 246 exposes the pixel electrode 210. At the same time, a gate pad contact hole 247 in the gate pad area GPA and a data pad contact hole 248 in the data pad area DPA are formed. The gate pad contact hole 247 exposes the gate pad electrode 209, and the data pad contact hole 248 exposes the data pad electrode 238.

Here, the active layer 220a is exposed between the source and drain electrodes 233 and 236, and then the passivation layer 240 is formed on the active layer 220a and the source and drain electrodes 233 and 236. Thus, the active layer 220a is not exposed to an etchant for a transparent conductive material.

The transparent conductive material may be dissolved in the etchant, and the transparent conductive material in the etchant may remain on the surface of the active layer if the active layer is exposed to the etchant. In such a case, the quality of the thin film transistor may be decreased, and driving problems may be caused.

On the other hand, in this embodiment, the active layer 220a forming a channel of the thin film transistor Tr is not exposed to the etchant for the transparent conductive material. Accordingly, the channel is prevented from being contaminated, and the quality of the thin film transistor Tr is maintained.

Figure 6F:
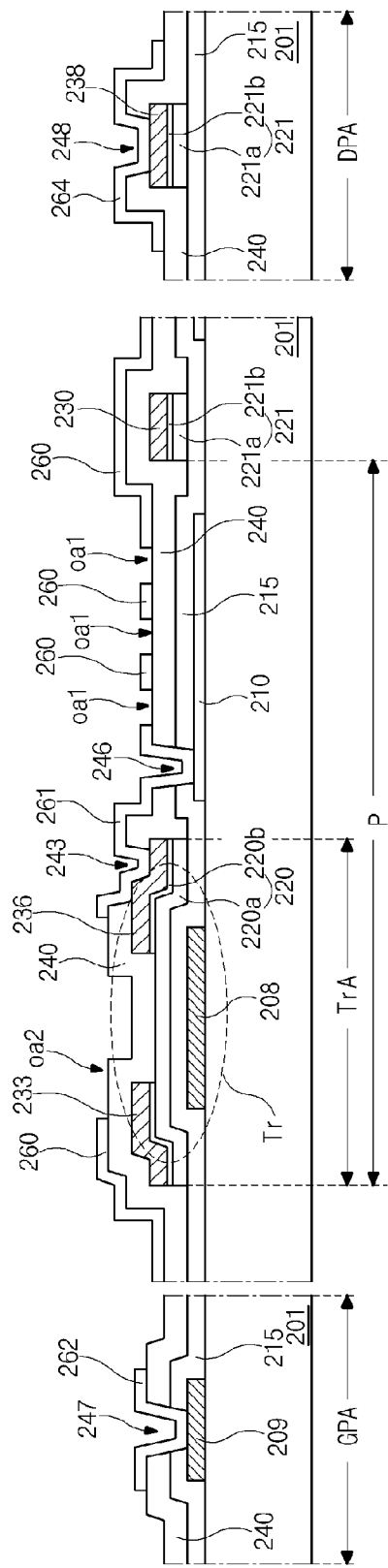

In FIG. 6F, a transparent conductive material including, for example, indium tin oxide (ITO) or indium zinc oxide (IZO) is deposited on a substantially entire surface of the passivation layer 240 including the drain contact hole 243, the pixel contact hole 246, the gate pad contact hole 247 and the data pad contact hole 248, thereby forming a second transparent conductive material layer (not shown).

Then, the second transparent conductive material layer is patterned through a mask process to thereby form a connection pattern 261 and a common electrode 260. The connection pattern 261 contacts the drain electrode 236 and the pixel electrode 210 through the drain contact hole 243 and the pixel contact hole 246, respectively. The common electrode 260 is spaced apart from the connection pattern 261 and has bar-shaped first openings oa1 corresponding to the pixel electrode 239 in the pixel region P.

At the same time, an auxiliary gate pad electrode 262 and an auxiliary data pad electrode 264 are formed in the gate pad area GPA and the data pad area DPA, respectively. The auxiliary gate pad electrode 262 contacts the gate pad electrode 109 through the gate pad contact hole 247, and the auxiliary data pad electrode 264 contacts the data pad electrode 238 through the data pad contact hole 248.

Accordingly, the array substrate for the FFS mode LCD device according to the second exemplary embodiment of the invention is completed.

According to additional embodiments of the present invention, in addition to the first openings corresponding to the pixel electrode 210, the common electrode 260 may have a second opening oa2 corresponding to the active layer 220a in the switching area TrA, and further a third opening (not shown) corresponding to the data line 230.

The second opening oa2 may prevent any potential parasitic capacitance formed by the common electrode 260, the gate electrode 208 and the layers interposed therebetween (i.e. the gate insulating layer 215, the semiconductor layer 220 and the passivation layer 240) as a dielectric layer from disturbing the formation of the channel in the active layer 220a.

The third opening (not shown) corresponding to the data line 230 prevents any potential parasitic capacitance formed between the data line 230, the common electrode 260 and the passivation layer 240 from delaying or decreasing the signal applied to the pixel electrode 210 through the data line 230.

In addition, although not shown in the figure, the first openings oa1 of the common electrode may be bent and symmetric with respect to a supposed horizontal line parallel to the gate line and crossing a central portion of the pixel region P. At this time, the data line 230 also may be bent corresponding to the central portion of the pixel region P to thereby form a zigzag shape in a display region of the device. The color shift can be prevented due to double domains.

In the array substrate for the FFS mode LCD device according to the second exemplary embodiment, a portion of copper or copper alloy contacting the transparent conductive material is not exposed to the etchant for the transparent conductive material. That is, the etchant does not permeate the interface between the materials and does not weaken the adhesion. Thus, the contact problem can be prevented.

The drain contact hole 243, the pixel contact hole 246, the gate contact hole 247 and the data contact hole 248 are completely covered by the second transparent conductive material, and then the second transparent conductive material is patterned. At this time, the inside of the contact holes 243, 246, 247 and 248 remain covered by the connection pattern 261, the auxiliary gate pad electrode 262 and the auxiliary data pad electrode 264, and thus the etchant for the transparent conductive material does not permeate the interface therebetween. Therefore, the contact problems do not occur.

In one aspect of the present invention, the array substrate for the FFS mode LCD device is manufactured through fewer mask processes compared to the methods in the related art. Accordingly, the manufacturing time and costs are decreased.

Moreover, in another aspect, the gate and data lines are formed of copper or copper alloy having relatively low resistivity, and thus the signal delays do not occur even if the gate and data lines have the same width and thickness as the related art.

Furthermore, when the gate and data lines are formed of copper, the contact problems are solved and the quality of the thin film transistor, including its efficiency and lifetime, is maintained.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A method of manufacturing an array substrate for a fringe field switching mode liquid crystal display device, comprising:

forming a gate line and a gate electrode on a substrate comprising a pixel region defined thereon;

forming a transparent pixel electrode in the pixel region directly on and contacting the substrate;

forming a gate insulating layer on the gate line, the gate electrode and the transparent pixel electrode, the gate insulating layer covering top and side surfaces of the transparent pixel electrode;

forming a data line, a source electrode, a drain electrode, and a semiconductor layer on the gate insulating layer, the data line crossing the gate line to define the pixel region, the semiconductor layer disposed over the gate electrode, the source electrode and the drain electrode spaced apart from each other over the semiconductor layer;

forming a passivation layer on the data line, the source electrode and the drain electrode, the passivation layer comprising a drain contact hole and a pixel contact hole; and forming a connection pattern and a common electrode on the passivation layer, wherein the common electrode comprises bar-shaped first openings in the pixel region, (ii) a second opening corresponding to the semiconductor layer and exposing a top surface of the passivation layer, and (iii) a third opening corresponding to the data line, and the connection pattern contacts the drain electrode and the transparent pixel electrode through the drain contact hole and the pixel contact hole, respectively.

2. The method according to claim 1, wherein forming the data line, the source electrode, the drain electrode and the semiconductor layer comprises:

forming an intrinsic amorphous silicon layer, an impurity-doped amorphous silicon layer, and a metal layer on the gate insulating layer;

forming first and second photoresist patterns on the metal layer, wherein the first photoresist pattern is thicker than the second photoresist pattern;

removing the metal layer, the impurity-doped amorphous silicon layer, and the intrinsic amorphous silicon layer using the first and second photoresist patterns as an etching mask to thereby form the data line, a source drain pattern, an impurity-doped amorphous silicon pattern and an intrinsic amorphous silicon pattern;

removing the second photoresist pattern by an ashing process to thereby a central portion of the source drain pattern;

removing the central portion of the source drain pattern and the impurity-doped amorphous silicon pattern to thereby form the source electrode, the drain electrode and the semiconductor layer, wherein the semiconductor layer comprises an active layer of intrinsic amorphous silicon and ohmic contact layers of impurity-doped amorphous silicon; and removing the first photoresist pattern.

3. The method according to claim 1, wherein the first openings are bent and symmetric with respect to a supposed line crossing a central portion of the pixel region and parallel to the gate line.

4. The method according to claim 1, wherein the transparent pixel electrode and the common electrode are formed of indium tin oxide or indium zinc oxide.

5. The method according to claim 1, wherein each of the gate line, the gate electrode, the data line, and the source and drain electrode has a single-layered structure comprising copper or copper alloy or has a double-layered structure comprising a lower layer of molybdenum or molybdenum alloy and an upper layer of copper or copper alloy.

6. The method according to claim 1, wherein forming the gate line comprises forming a gate pad electrode connected to one end of the gate line, wherein forming the data line comprises forming a data pad electrode connected to one end of the data line, wherein forming the passivation layer comprises forming a gate pad contact hole and a data pad contact hole exposing the gate pad electrode and the data pad electrode, respectively, and wherein forming the common electrode comprises forming an auxiliary gate pad electrode and an auxiliary data pad electrode, the auxiliary gate pad electrode contacting the gate pad electrode through the gate pad contact hole, the auxiliary data pad electrode contacting the data pad electrode through the data pad contact hole.

7. An array substrate for a fringe field switching mode liquid crystal display device, comprising:

a gate line and a gate electrode on a substrate comprising a pixel region defined thereon;

a transparent pixel electrode in the pixel region directly on and contacting the substrate;

a gate insulating layer on the gate line, the gate electrode and the transparent pixel electrode, the gate insulating layer covering top and side surfaces of the transparent pixel electrode;

a data line on the gate insulating layer and crossing the gate line to define the pixel region;

a semiconductor layer, a source electrode and a drain electrode on the gate insulating layer corresponding to the gate electrode;

a passivation layer on the data line, the source electrode and the drain electrode, wherein the passivation layer has a drain contact hole and a pixel contact hole exposing the drain electrode and the transparent pixel electrode, respectively;

a connection pattern on the passivation layer and contacting the drain electrode and the transparent pixel electrode through the drain contact hole and the pixel contact hole; and a common electrode on the passivation layer comprising (i) bar-shaped first openings corresponding to the transparent pixel electrode, (ii) a second opening corresponding to the semiconductor layer and exposing a top surface of the passivation layer, and (iii) a third opening corresponding to the data line.

8. The array substrate according to claim 7, wherein the first openings are bent and symmetric with respect to a supposed line crossing a central portion of the pixel region and parallel to the gate line.

9. The array substrate according to claim 7, wherein the transparent pixel electrode, the common electrode and the connection pattern are formed of a transparent conductive material.

10. The array substrate according to claim 7, wherein each of the gate line, the gate electrode, the data line, and the source and drain electrode has a single-layered structure comprising copper or copper alloy or has a double-layered structure comprising a lower layer of molybdenum or molybdenum alloy and an upper layer of copper or copper alloy.

11. The array substrate according to claim 7, wherein a gate pad electrode is formed at one end of the gate line and a data pad electrode is formed at one end of the data line, wherein the passivation layer comprises a gate pad contact hole and a data pad contact hole exposing the gate pad electrode and the data pad electrode, respectively, wherein an auxiliary gate pad electrode and an auxiliary data pad electrode are formed on the passivation layer, the auxiliary gate pad electrode contacts the gate pad electrode through the gate pad contact hole, and the auxiliary data pad electrode contacts the data pad electrode thorough the data pad contact hole.

12. The array substrate according to claim 7, wherein each of the transparent pixel electrode and the common electrode comprises indium tin oxide and/or indium zinc oxide.

13. The method according to claim 1, wherein the transparent pixel electrode, the common electrode and the connection pattern are formed of a transparent conductive material.

14. The array substrate according to claim 7, wherein the semiconductor layer comprises an active layer of intrinsic amorphous silicon and ohmic contact layers of impurity-doped amorphous silicon, and the second opening in the common electrode corresponds to the active layer.

15. The method according to claim 2, wherein the first openings are bent and symmetric with respect to a supposed line crossing a central portion of the pixel region and parallel to the gate line, the transparent pixel electrode and the common electrode comprise indium tin oxide and/or indium zinc oxide, and each of the gate line, the gate electrode, the data line, and the source and drain electrode has a single-layered structure comprising copper or copper alloy or has a double-layered structure comprising a lower layer of molybdenum or molybdenum alloy and an upper layer of copper or copper alloy, and forming the gate line comprises forming a gate pad electrode connected to one end of the gate line, wherein forming the data line comprises forming a data pad electrode connected to one end of the data line; forming the passivation layer comprises forming a gate pad contact hole and a data pad contact hole exposing the gate pad electrode and the data pad electrode, respectively; and forming the common electrode comprises forming an auxiliary gate pad electrode and an auxiliary data pad electrode, the auxiliary gate pad electrode contacting the gate pad electrode through the gate pad contact hole, the auxiliary data pad electrode contacting the data pad electrode through the data pad contact hole.

16. The array substrate according to claim 11, wherein the first openings are bent and symmetric with respect to a supposed line crossing a central portion of the pixel region and parallel to the gate line, the transparent pixel electrode, the common electrode and the connection pattern are formed of a transparent conductive material, and each of the gate line, the gate electrode, the data line, and the source and drain electrode has a single-layered structure comprising copper or copper alloy or has a double-layered structure comprising a lower layer of molybdenum or molybdenum alloy and an upper layer of copper or copper alloy.

* * * * *